US011761088B2

(12) United States Patent
Lagarde

(10) Patent No.: US 11,761,088 B2
(45) Date of Patent: Sep. 19, 2023

(54) SYSTEM AND METHOD FOR DEPOSITING OF A FIRST AND SECOND LAYER ON A SUBSTRATE

(71) Applicant: INNOFLEX TECHNOLOGIES B.V., Eindhoven (NL)

(72) Inventor: Kevin Johannes Hendrikus Lagarde, Alphen (NL)

(73) Assignee: INNOFLEX TECHNOLOGIES B.V., Eindhoven (NL)

( * ) Notice: Subject to any disclaimer, the term of this patent is extended or adjusted under 35 U.S.C. 154(b) by 242 days.

(21) Appl. No.: 17/292,570

(22) PCT Filed: Oct. 31, 2019

(86) PCT No.: PCT/NL2019/050716
§ 371 (c)(1),
(2) Date: May 10, 2021

(87) PCT Pub. No.: WO2020/101481
PCT Pub. Date: May 22, 2020

(65) Prior Publication Data
US 2022/0002874 A1 Jan. 6, 2022

(30) Foreign Application Priority Data
Nov. 14, 2018 (NL) ..................... 2021997

(51) Int. Cl.
*C23C 16/54* (2006.01)
*C23C 16/455* (2006.01)
*C23C 14/56* (2006.01)

(52) U.S. Cl.
CPC .......... *C23C 16/545* (2013.01); *C23C 14/562* (2013.01); *C23C 16/45544* (2013.01); *C23C 16/45551* (2013.01)

(58) Field of Classification Search
None
See application file for complete search history.

(56) References Cited

U.S. PATENT DOCUMENTS 4,013,539 A * 3/1977 Kuehnle ............. H01J 37/3277
432/236
6,299,707 B1 10/2001 McCay et al.
(Continued)

FOREIGN PATENT DOCUMENTS

EP 2557198 A1 2/2013
WO 2011068263 A1 6/2011

OTHER PUBLICATIONS

International Search Report and Written Opinion dated Mar. 12, 2020 for PCT/NL2019/050716.

*Primary Examiner* — Karla A Moore
(74) *Attorney, Agent, or Firm* — Suiter Swantz pc llo

(57) ABSTRACT

System and method for depositing a first layer on a flexible strip-shaped or sheet-shaped substrate and a second layer on the first layer. The system comprises a first deposition unit of a first type which is provided with a first supporting body, a conveying device for conveying the substrate in a conveying direction which extends parallel to a first central line of the first supporting body along the radial outer side of the supporting body. Downstream of the first deposition unit, the system furthermore comprises a second deposition unit which is provided with a second supporting body with a second central line which is in line with the first central line, and a wrapping device for keeping the substrate in a wrapped state, the substrate being wrapped around at least a part of the radial outer sides of the first supporting body and of the second supporting body.

20 Claims, 11 Drawing Sheets

(56) References Cited

U.S. PATENT DOCUMENTS

| | | | |
|---|---|---|---|
| 2006/0275548 A1* | 12/2006 | Storer | C23C 14/0021 |
| | | | 118/724 |
| 2014/0147592 A1* | 5/2014 | Hart | B01J 19/22 |
| | | | 427/372.2 |
| 2015/0086715 A1* | 3/2015 | Knaapen | C23C 16/45587 |
| | | | 118/715 |

* cited by examiner

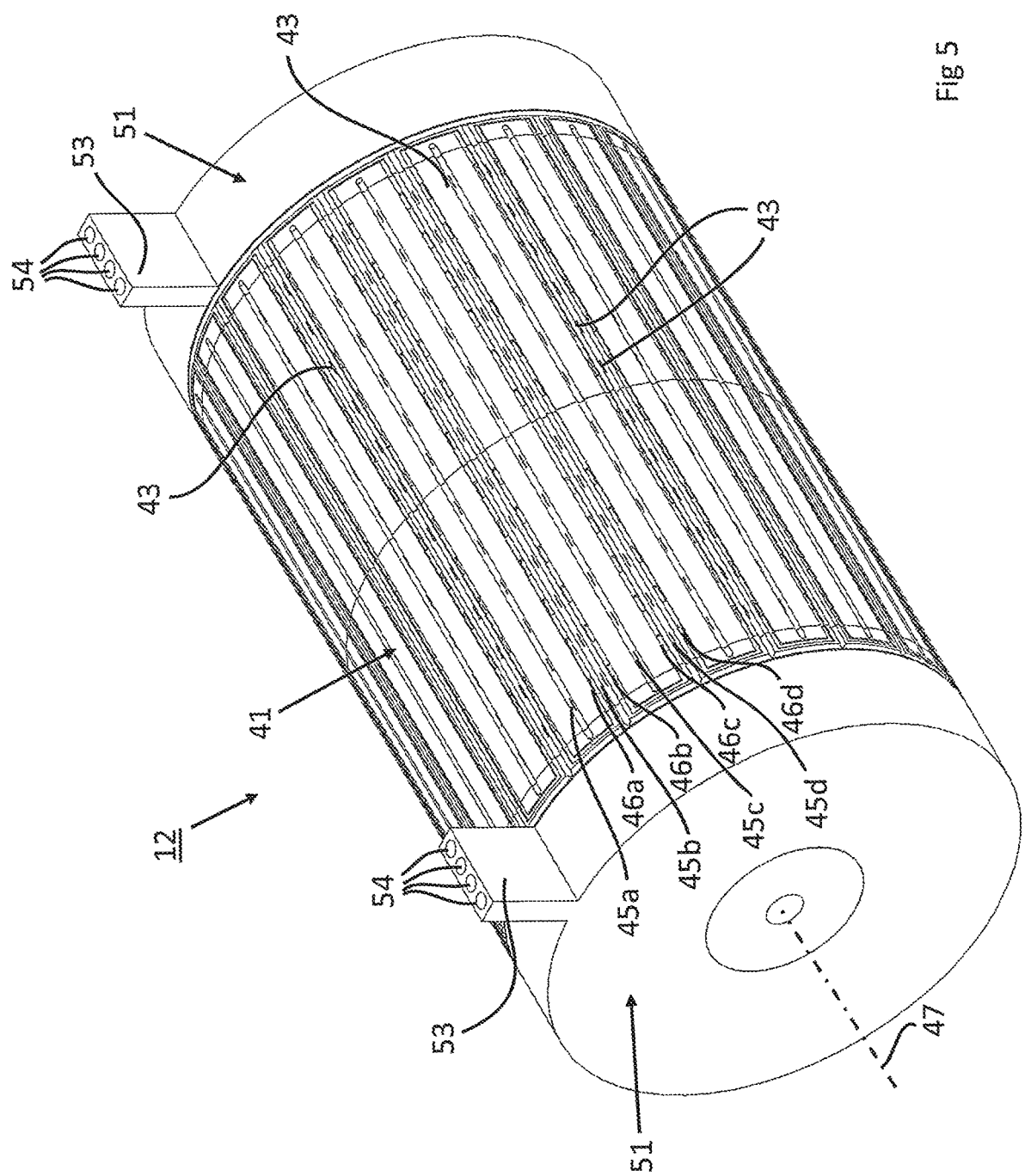

SYSTEM AND METHOD FOR DEPOSITING OF A FIRST AND SECOND LAYER ON A SUBSTRATE

TECHNICAL FIELD AND BACKGROUND

The present invention relates to a system for depositing a first layer on a flexible strip-shaped or sheet-shaped substrate and a second layer on the first layer.

European publication EP 2557198 A1 describes a number of devices for depositing an atomic layer on a strip-shaped substrate. The brief description of the variant from FIG. 11b of this publication, regards a drum which is provided with a deposition head and which is rotatable about its axis. In a way which is not explained any further, the substrate is wrapped around the largest part of the circular radial outer side of the drum, the length of the wrapped part of the substrate in the cross section according to aforementioned FIG. 11b being equal to the width of the substrate.

BRIEF SUMMARY

It is an object of the invention to provide a system by means of which at least two layers can be deposited on a substrate in an efficient manner, for example for use in solar cells. To this end, the invention provides, according to a first aspect, a system according to Claim 1. Such a system is suitable for depositing at least two layers on a substrate in an efficient, automated and, if desired, continuous manner. The invention is in particular directed at use on substrates with a thickness of between 1 µm and 2 mm, for example of (flexible) glass, aluminium or plastic. Incidentally, in this case it is not necessary for there to be a (permanent) bond between the substrate on the one hand and the at least two deposited layers on the other hand. Thus, the substrate does not necessarily form part of the finished product. The finished product may be, for example, a membrane with a thickness of, for example, a few nanometres.

The dimensions of the supporting bodies used, viewed in cross section, i.e. at right angles to the conveying direction, will in practice be tailored to the dimensions of the substrate, more specifically in the case of a strip-shaped substrate, to the width of the substrate. The length of the deposition units, more specifically the size of the deposition unit, viewed in the conveying direction, to a large degree determines the capacity of the system. With a system according to the invention, the diameters of the supporting bodies used may typically be between 0.25 metres and 2.5 metres, while the lengths of the deposition units used, which lengths may, incidentally, be equal to each other or may differ from each other, may typically be between 0.25 metres and 4.0 metres.

The advantages of the invention or at least of preferred embodiments which are still to be discussed below may also be relevant if the system only comprises a single deposition unit. In that case, this is a system for depositing a layer on a flexible strip-shaped or sheet-shaped substrate, the system comprising a deposition unit for depositing the layer, the deposition unit being provided with a supporting body with a central line and with a radial outer side which is rotationally symmetrical with respect to the central line, the system furthermore comprising a conveying device for conveying the substrate in a conveying direction which extends parallel to the central line of the supporting body along the radial outer side of the supporting body, and a wrapping device for keeping the substrate in a wrapped state during transportation in the conveying direction of the substrate, the substrate being held wrapped around at least a part, preferably the largest part or more than half, of the radial outer side or about the entire radial outer side of the supporting body.

The invention is particularly suitable for use with deposition units of the Spatial Atomic Layer Deposition (S-ALD) type, the Chemical Vapor Deposition (CVD) type, the sputter-type or the spray-coating type. The processes associated with such types are known per se to those skilled in the art, inter alia the fact that a layer, such as an atomic layer, can be deposited on a substrate by means of these techniques. The invention uses the same or different deposition processes on a substrate sequentially. Thus, it is possible to deposit different layers, for example those used in solar cells, displays and flexible electronics (thin-film electronics) in which case the substrates may be relatively large and may, for example, be processed to form large displays, for example in a display with a size of 6×10 metres for use in a cinema. In addition, the invention provides the advantage that in order to deposit the first layer and the second layer, it is not necessary to deform the substrate between these depositions, so that the mechanical load on the substrate can remain limited and, in addition, the system can be of a relatively simple design.

The advantages of the invention may be particularly relevant if the first type and the second type differ from one another. In this case, the first type and the second type may be adapted to the requirements which have to be met by the first layer and the second layer, for example with regard to the composition, thickness or structure thereof. If the respective deposition units are of modular design, they can be changed relatively easily, as a result of which the system can be used in a flexible manner in order to deposit desired layers on substrates.

On the other hand, depending on the application of the system, the advantages of the invention may also be relevant if the first type and the second type are in fact identical to each other. In general, the system may also comprise more than two deposition units, in which case there may even be three or more different types of deposition units whose axes are in line with each other.

The invention is very suitable for use with one or more deposition units of the Spatial Atomic Layer Deposition (S-ALD) type. In that case, the supporting body associated with the deposition unit of the S-ALD type is cylindrical, has a central line and is provided with an arcuate or circular deposition surface on its radial outer side. In this case, the deposition unit of the S-ALD type is furthermore provided with a gas supply device for supplying precursor gas to the deposition surface thereof, and with a first drive device for driving the supporting body about the central line in a rotating manner, the supporting body being configured to supply the precursor gas to the inner side of a substrate wrapped around the supporting body via the deposition surface thereof in order to deposit a layer on or at least on the inner side of the substrate, due to a chemical reaction of the precursor gas on or near the substrate. The S-ALD process as such is known to those skilled in the art, for example from European publication EP 2557198, and therefore does not have to be explained in more detail in this document. The S-ALD process may concisely be described as a process in which precursor gas is supplied to a substrate cyclically and atoms of the precursor gas adhere to the substrate, and subsequently reaction gas is supplied to the substrate which reacts chemically with the precursor gas resulting in an atomic layer on the substrate. In between the supply of the respective gases, the gases are sucked from the substrate in order to prevent the aforementioned chemical reaction from also taking place at other locations than on the substrate, or that undesired or parasitic deposition takes place.

In order to prevent undesired deformation of the substrate in the wrapped state and to prevent physical contact between the deposition surface and the inner side of the substrate, it may be advantageous if the deposition unit, such as of the S-ALD type but also of other types, as mentioned above, such as during sputtering, chemical vapor deposition and spray-coating, comprises a vacuum device for producing a reduced pressure on the outer side of the substrate. Such a reduced pressure may be used to exert a radially outwardly directed pushing force from the inner side of the substrate on the substrate in order to compensate for a radially inwardly directed pushing force on the substrate due to a reduced pressure between the substrate and the radial outer side of the deposition body. The aforementioned radially outwardly directed pushing force may be used to move the substrate radially outwards at a (small) distance from the radial outer side, more specifically the deposition surface, of the respective supporting body, in which case the substrate retains a cylindrical shape. Physical contact between the deposition surface and the substrate could result in interference with the deposition process and to damage of the substrate or of one or a number of layers deposited on the substrate.

The optional measures described in the previous paragraph may also be advantageous when using a system which is designed without a second deposition unit. In that case, this involves a system for depositing a layer on a flexible strip-shaped or sheet-shaped substrate, the system comprising a deposition unit, such as of the S-ALD type, for depositing the layer, the deposition unit being provided with a supporting body with a central line and with a radial outer side which is rotationally symmetrical with respect to the central line, the system furthermore comprising a conveying device for conveying the substrate in a conveying direction which extends parallel to the central line of the supporting body along the radial outer side of the supporting body, and a wrapping device for keeping the substrate in a wrapped state, the substrate being held wrapped around at least a part, preferably the largest part or more than half, of the radial outer side or about the entire radial outer side of the supporting body, wherein the deposition unit comprises a vacuum device for producing a reduced pressure on the outer side of the substrate.

In particular, it may be useful if the first type and the second type are of the Spatial Atomic Layer Deposition (S-ALD) type. Such a system may advantageously be used, for example, in the production of solar panels of the CIGS type, more specifically for successively depositing a ZN(O, S) layer, a so-called buffer layer, and a ZnO;Al layer, a so-called window layer, as is used with solar panels of the CIGS type.

Optionally in combination with the use of at least one deposition unit of the S-ALD type, it is furthermore also possible within the scope of the invention that the first type and/or the second type is the spray-coating type, wherein the deposition unit of the spray-coating type comprises a spray body with a central line which coincides with the central line of the supporting body associated with the deposition unit of the spray-coating type and which spray body is provided with spray nozzles for spraying the spray material to be deposited from the spray nozzles to the inner side of a substrate wrapped around the supporting body for depositing a layer of the spray material on or at least on the inner side of the substrate. In the aforementioned example of application of the system according to the invention in the production of solar panels of the CIGS type, a deposition unit of the spray-coating type may, for example, advantageously be used for depositing the CIGS layer, as is used with solar panels of the CIGS type.

If the deposition unit of the spray-coating type is provided with a second drive device for driving the spray body in a rotating manner about the central line of the spray body, the uniformity of the layer thickness of the layer which is deposited by means of the deposition unit of the spray-coating type may thus be improved.

According to a further possible embodiment, the first supporting body and/or the second supporting body is ring-shaped or disc-shaped. In general, and in particular when using ring-shaped or disc-shaped supporting bodies, it is also possible for a deposition unit to be provided with two or more supporting bodies.

To prevent contact between (the radial outer side of) a supporting body and the inner side of the substrate, it may furthermore be advantageous if openings are provided on the radial outer side of the first supporting body and/or the second supporting body for allowing a gas to pass through these openings in a radially outwardly directed direction for, in use, creating a gas layer between the inner side of a substrate wrapped around the first supporting body and/or second supporting body and the respective first supporting body and/or second supporting body, or a gas bearing of the substrate. Such contact may result in damage of the substrate or of a layer deposited upstream on the substrate.

In particular for the sake of large-scale production, it may furthermore be advantageous if the conveying device is provided with a first deformation device on the upstream side of the first deposition unit for deforming the substrate from a flat state of the substrate to the wrapped state during transportation of the substrate and/or if the conveying device is provided with a second deformation device on the downstream side of the second deposition unit for deforming the substrate from the wrapped state of the substrate to a flat state during transportation of the substrate. Said deformation devices may advantageously comprises a guiding surface which is curved in two perpendicular directions for guiding the substrate for deforming the substrate from the flat state to the wrapped state or vice versa during transportation of the substrate along the respective guiding surface.

The optional measures described in the above paragraph may also be advantageous when using a system which is designed without a second deposition unit. In that case, this involves a system for depositing a layer on a flexible strip-shaped or sheet-shaped substrate, the system comprising a deposition unit, preferably of the S-ALD type, for depositing the layer, the deposition unit being provided with a supporting body with a central line and with a radial outer side which is rotationally symmetrical with respect to the central line, the system furthermore comprising a wrapping device for keeping the substrate in a wrapped state, the substrate being wrapped around at least a part, preferably the largest part or more than half, of the radial outer side of the supporting body and wherein the conveying device is provided with a first deformation device on the upstream side of the deposition unit for deforming the substrate from a flat state of the substrate to the wrapped state during transportation of the substrate and/or, if the conveying device is provided with a second deformation device on the downstream side of the deposition unit, for deforming the substrate from the wrapped state of the substrate to a flat state during transportation of the substrate.

Large-scale production may furthermore benefit if the conveying device comprises an unwinding body on the upstream side of the first deposition unit for supporting and unwinding a roll of the substrate and/or if the conveying device comprises a winding body on the downstream side of the second deposition unit for supporting the substrate and winding it up to form a roll. The driving force or at least a supporting force for transportation of the substrate in the conveying direction may in this case advantageously be provided by a third drive device for driving the winding body in a rotating manner.

In particular for use with fragile substrates which can only be subjected to limited mechanical loads, the system may advantageously be configured in such a manner that the conveying device comprises an endless flexible support belt for supporting the substrate on the outer side of the substrate in the wrapped state of the substrate, and a first circulating body on the upstream side of the first deposition unit, a second circulating body on the downstream side of the second deposition unit around which circulating bodies the support belt is wrapped, and a fourth drive device for driving the support belt in such a way that, during use, the support belt moves in the conveying direction together with the substrate in the area where the substrate is supported by the support belt. The use of such a support belt may improve the dimensional stability of the substrate in the wrapped state and thus improve the constancy of the distance between the inner side of the substrate and the radial outer sides of the supporting bodies.

The optional measures described in the above paragraph may also be advantageous when using a system which is configured without a second deposition unit. In that case, this involves a system for depositing a layer on a flexible strip-shaped or sheet-shaped substrate, the system comprising a deposition unit, preferably of the S-ALD type, for depositing the layer, the deposition unit being provided with a supporting body with a central line and with a radial outer side which is rotationally symmetrical with respect to the central line, the system furthermore comprising a wrapping device for keeping the substrate in a wrapped state, the substrate being wrapped around at least a part, preferably the largest part or more than half, of the radial outer side of the supporting body and wherein the conveying device comprises an endless flexible support belt for supporting the substrate on the outer side of the substrate in the wrapped state of the substrate, and a first circulating body on the upstream side of the first deposition unit, a second circulating body on the downstream side of the second deposition unit around which circulating bodies the support belt is wrapped, and a fourth drive device for driving the support belt in such a way that, in use, in the area where the substrate is supported by the support belt, the support belt moves in the conveying direction together with the substrate.

In a practical embodiment, the wrapping device comprises two elongate guide members on the outer sides of the first supporting body and the second supporting body, which elongate guide members extend parallel to each other and to the conveying direction for guiding the support belt on opposite longitudinal edges thereof. To this end, the support belt may, for example, be provided with a thickening on these longitudinal edges which facilitates cooperation between the support belt and guide members.

In a further practical embodiment, the wrapping device comprises two elongate wrapping members on the outer sides of the first supporting body and the second supporting body, which elongate wrapping members extend parallel to each other and to the conveying direction for wrapping the support belt around, near the longitudinal edges thereof.

As has already been mentioned above, it is readily possible to configure the system to have more than two deposition units. For that reason, one embodiment mentions that the system comprises at least one further deposition unit for depositing at least one further layer, each of the at least one further deposition unit comprising a further supporting body with a further central line which is in line with the first central line and with the second central line, each further deposition unit being of the first type, of the second type or of a further type.

It is also advantageously possible for the system to also contain units which, in contrast to the aforementioned deposition units, are not configured to deposit a layer, but to treat such layers and/or the substrate. In this context, a further embodiment of the system furthermore comprises a laser treatment unit for treating the substrate, the first layer and/or the second layer with at least one laser beam, the laser treatment unit being provided with a third supporting body with a third central line and with a radial outer side which is rotationally symmetrical with respect to the third central line, wherein the third central line is in line with the first central line. In this case, the laser treatment unit would very suitably be, for example, of the laser-scribing type, in which the treatment of the laser beam is configured to remove local material from the first layer, the second layer and/or the substrate or to influence the properties of the material. To this end, the laser treatment unit comprises at least one laser head which is provided on the inner side of the radial outer side of the third supporting body.

Such a laser treatment unit could also be used in a system which comprises no deposition units. In that case, this involves a system for treating a flexible strip-shaped or sheet-shaped substrate and/or at least a layer deposited on the substrate with a laser beam, the system comprising a laser treatment unit for treating the substrate and/or at least the layer deposited on the substrate with at least one laser beam, the laser treatment unit being provided with a supporting body with a central line and with a radial outer side which is rotationally symmetrical with respect to the central line, the system furthermore comprising a conveying device for conveying the substrate in a conveying direction which extends parallel to the first central line of the supporting body along the radial outer side of the supporting body, the system furthermore comprising a wrapping device for keeping the substrate in a wrapped state during transportation in the conveying direction, the substrate being wrapped around at least a part, preferably the largest part or more than half, of the radial outer sides or around the entire radial outer side of the supporting body.

The invention also relates to a deposition unit for use as first or second deposition unit in a system according to the invention as described above and to a laser treatment unit for use in a system as described above.

According to a further aspect, the invention also relates to a method for depositing a first layer on a flexible strip-shaped or sheet-shaped substrate and a second layer on the first layer by using a system according to the invention as discussed above. The advantages connected to such a method will already have become clear to those skilled in the art on the basis of the above description of the system according to the invention.

In case the system comprises a laser treatment unit, the method may furthermore comprise the step of treating the substrate, the first layer and/or the second layer with the laser treatment unit with at least one laser beam, for example for so-called laser-scribing.

BRIEF DESCRIPTION OF THE DRAWINGS

The invention will be explained in more detail by means of the description of the following figures, in which:

FIG. 5 shows a first deposition unit of the S-ALD type;

FIG. 7b shows an isometric longitudinal section of a detail of the deposition unit from FIG. 7a;

DETAILED DESCRIPTION

Figure 1:
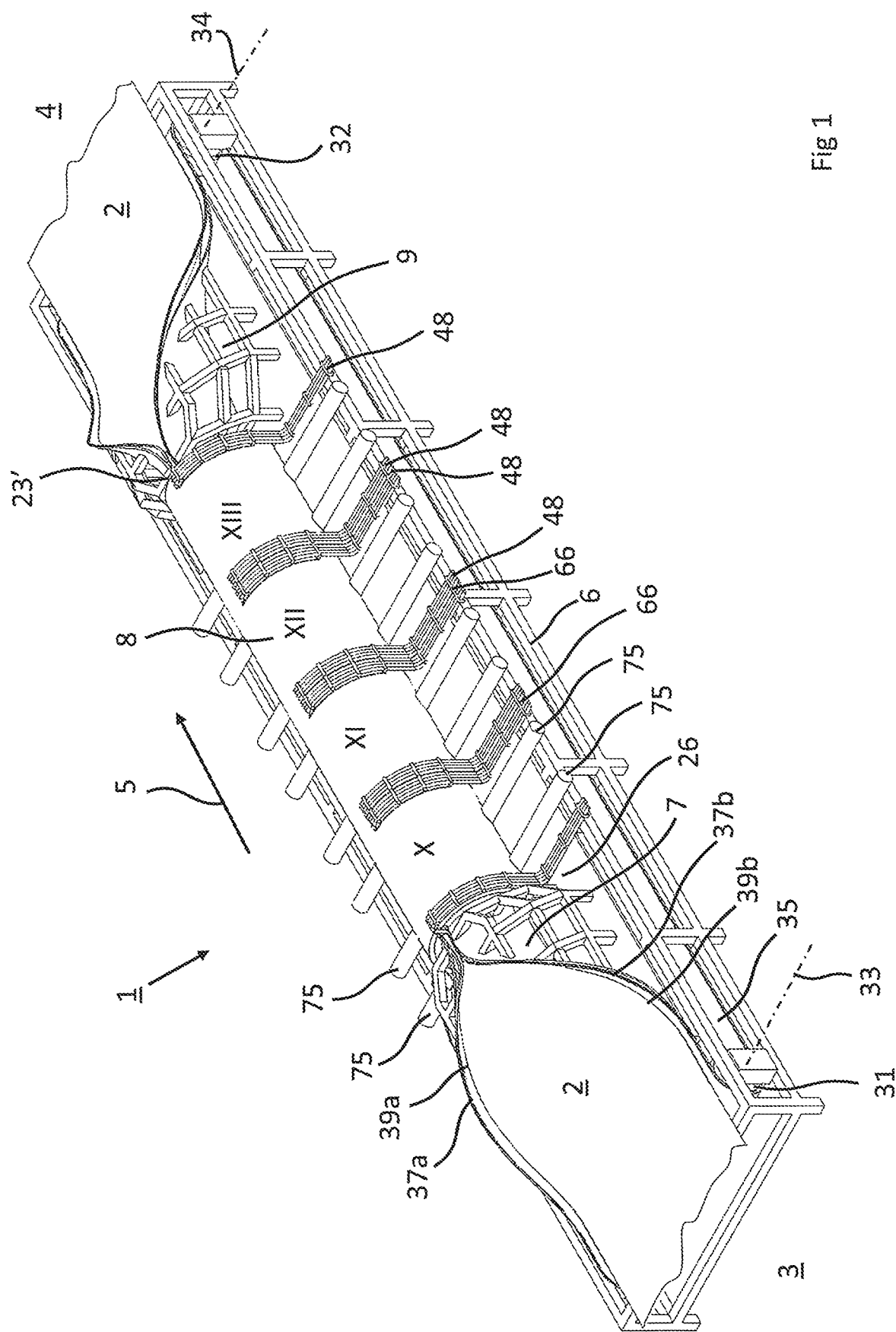
FIG. 1 shows an isometric overall view of the system according to the invention.

FIG. 1 shows a system 1 according to the invention for depositing layers on a flexible strip-shaped substrate 2. On its upstream side 3, the system comprises an unwinding roller (not shown) from which the strip-shaped substrate 2 is unwound. On the downstream side 4 of the system 1, the system 1 furthermore comprises a winding roller (not shown) around which the strip-shaped substrate 2, on which the system 1 has deposited a number of layers in a way which is to be explained in more detail below, is wound up again. This winding roller is driven in a rotating manner, as a result of which the strip-shaped substrate 2 moves in the conveying direction 5.

Figure 2:
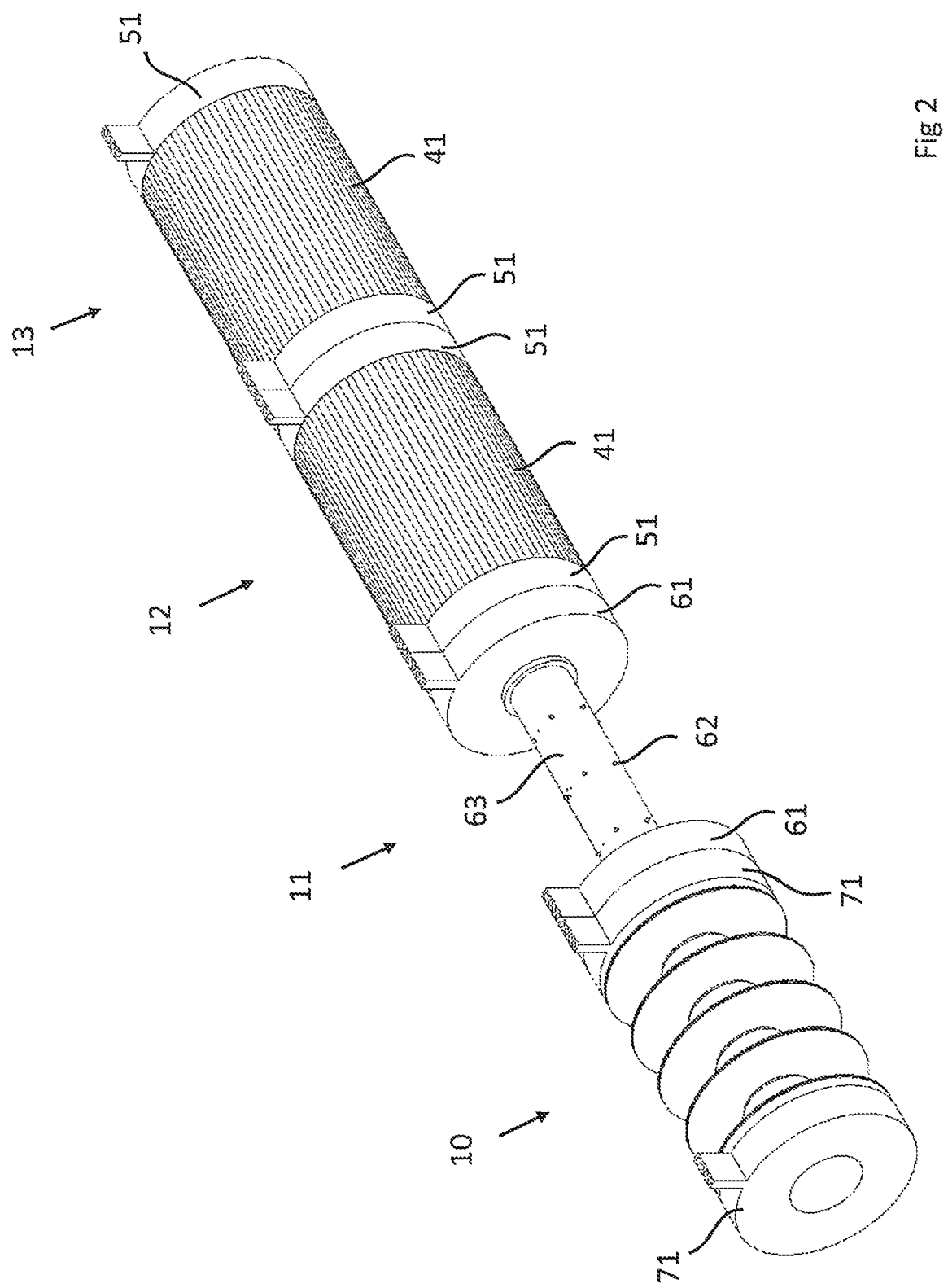
FIG. 2 shows four consecutive deposition units of the system from FIG. 1.

System 1 furthermore comprises a frame 6 and, viewed in the conveying direction 5, successively a first guide body 7 (see also FIGS. 4a and 4b), a vacuum chamber, which is configured as a vacuum tube 8, and a second guide body 9. Inside the vacuum tube 8, the system, viewed in conveying direction 5, successively comprises, at the longitudinal locations X, XI, XII and XIII, deposition units 10, 11, 12 and 13 (see FIG. 2), each having a length of 2.8 metres in the chosen exemplary embodiment. These deposition units 10-13 which, incidentally, can also be used individually, that is to say without any of the other deposition units, will be described below in more detail.

Figure 4A:
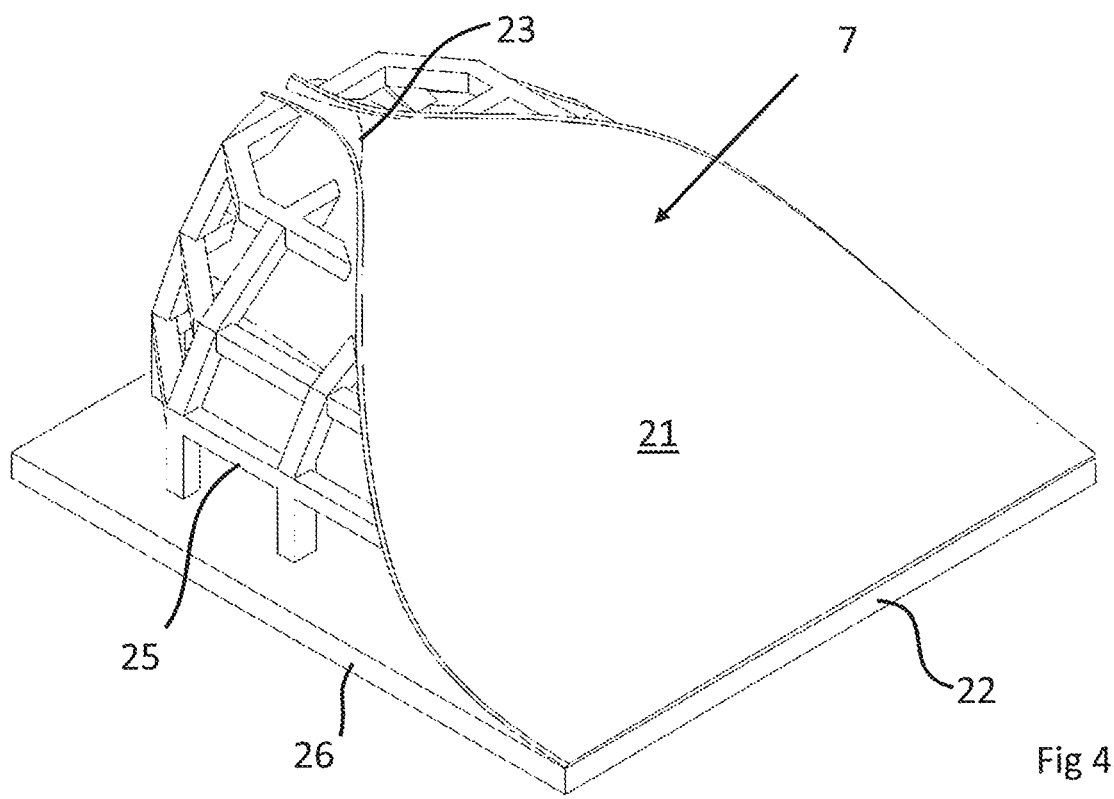
FIGS. 4a and 4b respectively show an isometric view and a front view of a first guide body of the system.
Figure 4B:
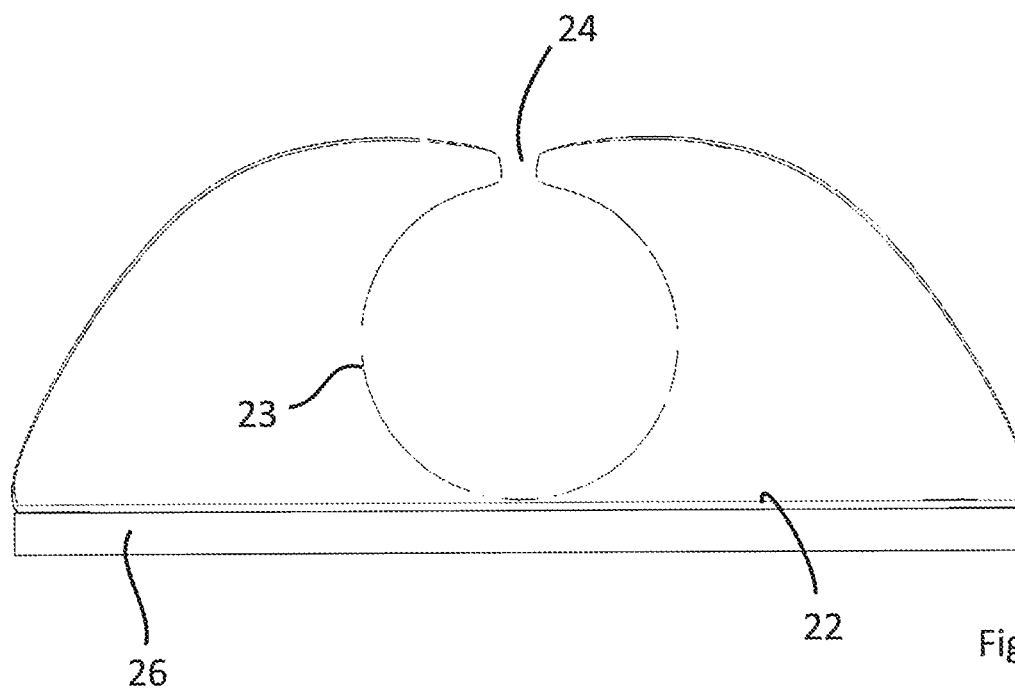

FIGS. 4a and 4b show the first guide body 7. The first guide body 7 has a first guiding surface 21 which is curved in two perpendicular directions. This curvature is such that the first guiding surface 21 changes from an orientation which is flat, at least in vertical cross section, on the upstream side of the first guiding surface 21 at the location of transverse edge 22 of the first guiding surface 21, to an at least substantially circular vertical cross section on the downstream side of the first guiding surface 21 at the location of the transverse edge 23 of the first guiding surface 21 situated opposite transverse edge 22. On the upper side, said circle shape has a narrow slit 24. Due to the narrow slit 24, the length of transverse edge 23, insofar as this defines the aforementioned circle shape, referred to below as the arc length part of transverse edge 23, is less than two times π times the radius of curvature r of the circle shape or smaller than the theoretical circumference of a hypothetical full circle with a radius of curvature r. On the other hand, the arc length part of transverse edge 23 is preferably greater than 0.75 times the aforementioned theoretical circumference or more preferably even greater than 0.9 times the aforementioned theoretical circumference. The arc length part of transverse edge 23 is smaller than the length of transverse edge 22 to a limited degree.

The first guide body 7 which may, for example, be configured as a plastically deformed metal plate is supported by a framework 25 which is in turn supported by plate body 26. Plate body 26 is mounted on the frame 6 and partly extends under the first guide body 7 and the second guide body 9 and extends completely under the vacuum tube 8. The plate body 26 may be formed as a single part, but may obviously also be constructed from a number of plate sections.

The second guide body 9 is of a similar design to the first guide body 7, but mirrored with respect to a hypothetical vertical mirror plane which extends at right angles to the conveying direction 5 in a position between the deposition units 11 and 12.

On the upstream side of the first guide body 7, under the level of plate body 26, system 1 furthermore comprises a deflector roller 31, and on the downstream side of the second guide body 9, likewise under the level of plate 26, a second deflector roller 32. The deflector rollers 31, 32 are rotatably connected to the frame 6 about respective axes 33, 34 thereof, which are oriented horizontally and extend at right angles to the conveying direction 5. The two deflector rollers 31, 32 are rotatably drivable by means of drive means (not shown), such as for example a servomotor.

An endless flexible support belt 35, for example made of plastic or rubber, is wrapped around the two deflector rollers 31, 32. In the bottom part of the support belt 35 which extends between the undersides of the deflector rollers 31, 32, support belt 35 extends horizontally and flat. In the top part which extends above the deflector rollers 31, 32, the support belt 35 is guided over the guiding surface 21 of both the first guide body 7 and the second guide body 9, as a result of which the top part of the support belt 35, viewed in the conveying direction 5 along the length of the first guiding surface 21, goes from a flat orientation at the location of transverse edge 22 of the first guide body 7 to a so-called wrapped orientation at the location of transverse edge 23 of the first guide body 7. Due to the propulsion of deflector roller 34, the conveyor belt 35 remains in this wrapped state during transportation of the support belt 35 in the conveying direction 5, until the moment that the support belt 35 arrives at the, at least substantially circular transverse edge 23' of the second guide body 9 and there forms the curved form of the second guiding surface 21' of the second guide body 9, so that the guide belt 35 on the transverse edge 22' of the second guide body 9 has assumed a flat orientation again. As an alternative to the first guide body 7 and the second guide body 9, it is also possible to provide the support belt 35 with thickenings 38a, 38b on the longitudinal edges 37a, 37b thereof, which will be explained below with reference to FIG. 6, or with roller bodies, which run inside guides as guide rails 49a, 49b, in order thus to bring about the deformation from a flat to a cylindrical shape and vice versa.

The width of the support belt 35 is greater than the arc length part of transverse edge 23. This results in the support belt 35, on its two opposite longitudinal sides, extending through slit 24, with the opposite longitudinal edges 37*a*, 37*b* of support belt 35 being directed upwards. Inside the vacuum tube 8, the support belt 35, at the location of its aforementioned longitudinal sides, is wrapped around two respective elongate guide rods 36*a*, 36*b* which extend parallel to each other and to the conveying direction 5.

Figure 6:
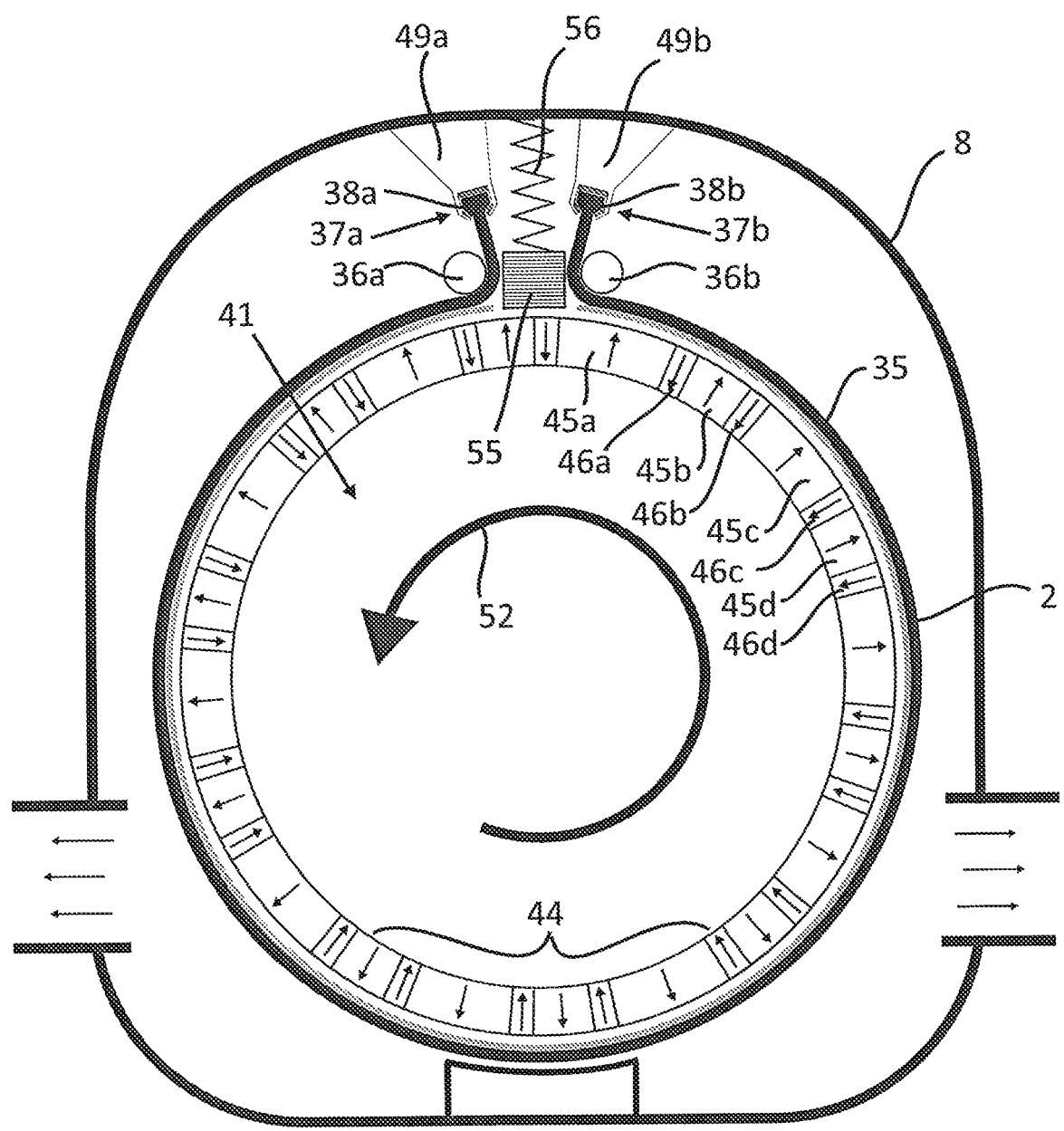
FIG. 6 diagrammatically shows a cross section of the system at the location of a deposition unit of the S-ALD type.

On its two opposite longitudinal edges 37*a*, 37*b*, the support belt 35 is provided with thickenings 38*a*, 38*b* (FIG. 6). These thickenings may be formed, for example, by making the support belt 35 on the longitudinal edges 37*a*, 37*b* locally thicker. Alternatively, the longitudinal edges 37*a*, 37*b* of the support belt 35 could be provided with chambers which extend over the length of the support belt 35 and in which a thickening member, such as a lace or cord is incorporated. The thickenings 38*a*, 38*b* are guided in guide rails 49*a*, 49*b* on the downstream side of the first guide body 7. As can also be seen in FIG. 3, these guide rails 49*a*, 49*b* are attached on the inner side of vacuum tube 8 and extend along the entire length thereof above the deposition units 10-13 which are arranged inside the vacuum tube 8.

The aforementioned deposition units 12, 13 are deposition units of the Spatial Atomic Layer Deposition (S-ALD) type. The S-ALD process by which atomic layers can be deposited on a substrate is known per se to those skilled in the art and is described, inter alia, in the aforementioned European publication EP 2557198. Therefore, a detailed explanation of the S-ALD process is not necessary here.

Figure 3:
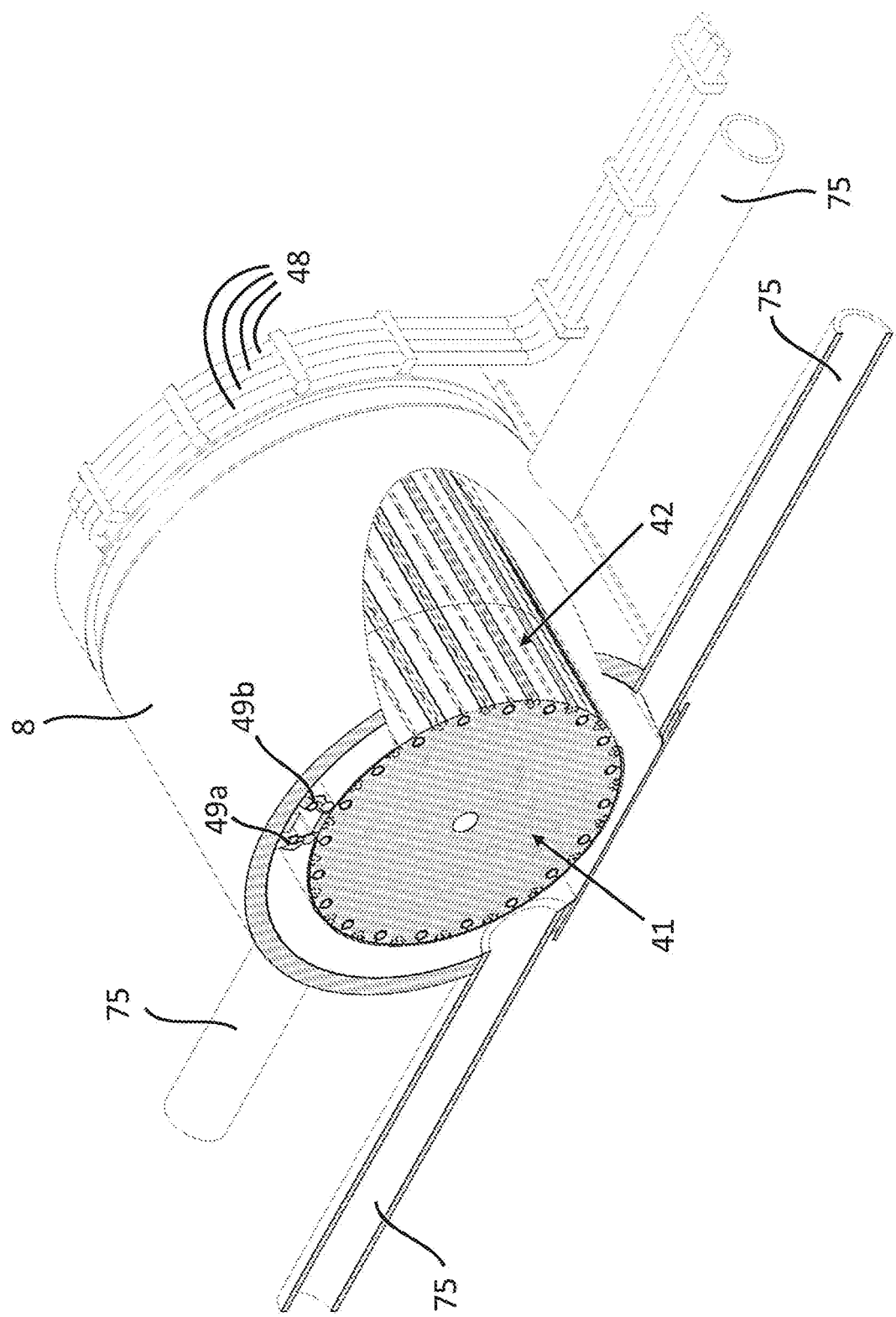
FIG. 3 shows a cross section through the system at the location of a deposition unit of the S-ALD type.

With reference in particular to FIGS. 3, 5 and 6, each deposition unit 12, 13 of the S-ALD type comprises a cylindrical deposition body 41 on the radial outer side of which a deposition surface 42 is provided which is circular in the cross section from FIG. 6.

In the example from FIG. 6, the deposition surface 42 comprises five deposition surface units 44 which together form the entire deposition surface and which each alternately comprise four gas supply units 45*a*-45*d* and four gas discharge units 46*a*-46*d*. Each of the gas supply units 45*a*-45*d* and gas discharge units 46*a*-46*d* comprises slot-shaped holes 43 in the deposition surface 42 for supplying or discharging gas via these holes 43, as will be explained below. The holes 43 for each gas supply unit 45*a*-45*d* and gas discharge unit 46*a*-46*d* are provided at a regular distance apart in a row with the respective rows extending over the entire length of the deposition body 41.

Following the principles of the S-ALD process, during a rotation of the deposition body 41 about its axis in the direction of arrow 52 which is still to be explained in more detail, a so-called precursor gas is supplied via openings in gas supply unit 45*a* to the inner side of the substrate 2 which is in the wrapped state. The precursor gas adheres to the substrate as an atomic layer. Gas discharge unit 46*a* then sucks the excess of precursor gas, i.e. the precursor gas which has not adhered to the substrate 2, out again. At the location of gas supply unit 45*c*, via openings therein, a reaction gas is supplied to the inner side of the substrate 2 which reacts with the precursor gas adhering to the substrate, which reaction causes a layer to be formed on the inner side of the substrate 2. The reaction gas is sucked out via gas discharge unit 46*c*. Between the combinations of a gas supply unit 45*a* and a neighbouring gas discharge unit 46*a* and of a gas supply unit 45*c* and a neighbouring gas discharge unit 46*c*, combinations of a gas supply unit 45*b* and a neighbouring gas discharge unit 46*b* or of a gas supply unit 45*d* and a neighbouring gas discharge unit 46*d* are provided. Via the gas supply units 45*b* and 45*d*, inert gas is supplied to the inner side of the substrate 2 which is sucked out again via the associated gas discharge units 46*b* and 46*d*.

In this case, the function of the inert gas is to separate the precursor gas and the reaction gas.

Just like the deposition unit 13, deposition unit 12 furthermore comprises at least substantially disc-shaped stationary supporting bodies 51 at its head ends which are concentrically connected to an associated deposition body 41. The supporting bodies 51 serve to support the substrate 2, as incidentally does the deposition body 41 of each deposition unit 12, 13 of the S-ALD type. This support may be effected directly as well as via gas bearings between the supporting bodies 51 and the substrate 2.

In this case, the deposition body 41 is rotatable about its axis 47 with respect to the supporting bodies 51 according to arrow 52 by means of drive means (not shown) which are provided inside one or both supporting bodies 51. On the upper sides, the supporting bodies 51 are provided with a narrow coupling piece 53, on the upper sides of which four lines 54 end. In total, there are thus eight lines 54 for each deposition unit 12 or 13. Each of these lines 54 is communicatively connected to one of the four gas supply units 45*a*-45*d* or one of the gas discharge units 46*a*-46*d* of each deposition surface unit 44. For this purpose, it is for example possible to use annular chambers in the supporting bodies 51 on the respective sides thereof facing the deposition body 41. In use, gas supply lines 48*a* or gas discharge lines 48*b*, collectively denoted by reference numeral 48, are connected at the location of the outlets of the lines 43 for supplying precursor gas, reaction gas or inert gas to the associated gas supply units 45*a*-45*d* or for discharging one of the aforementioned gases via an associated gas discharge unit 46*a*-46*d*.

When system 1 is in use, the coupling pieces 53 extend between the longitudinal edges 39*a*, 39*b* of substrate 2 and between the guide rods 36*a*, 36*b*. The aforementioned gas supply lines 48*a* and gas discharge lines 48*b* run through the wall of vacuum tube 8, on the upper side thereof (FIG. 3). Between the two coupling pieces 53 of every deposition unit 12, 13 of the S-ALD type, the deposition unit 12, 13 is provided with an elongate closure body 55 which extends over the respective axial length of the deposition body 41 of the deposition units 12, 13. The closure body 55 is situated between the longitudinal edges 39*a*, 39*b* of the substrate 2 and closes the part of deposition surface 42 which is not enveloped by substrate 2. The closure body 55 is kept in a desired radial position by means of spring 56, one end of which is connected to the inner side of vacuum tube 8 and the opposite end of which is connected to the closure body 55. If a force acts on the closure body 55, for example due to a pressure difference on opposite sides of the closure body 55 which causes the closure body 55 to incline to a different radial position than the desired radial position, the spring will counteract such an inclination in order to force the closure body 55 to return to the desired radial position or will keep it in the desired radial position.

Figure 8:
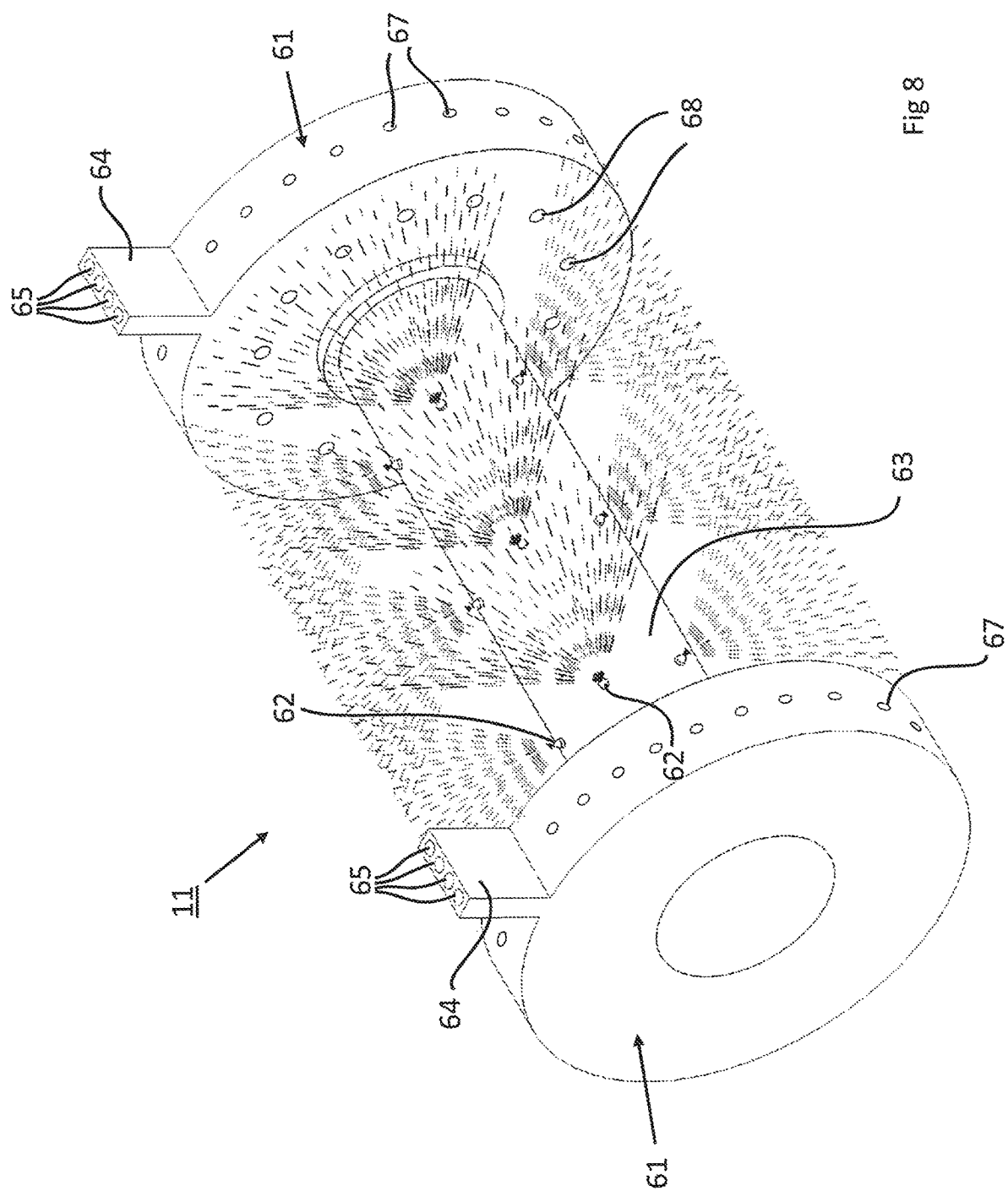
FIG. 8 shows a deposition unit of the spray-coating type which forms part of the system.

Deposition unit 11 (FIG. 8) is of the spray-coating type. On two opposite sides, deposition unit 11 comprises a stationary supporting body 61 which are each of the same design as supporting bodies 51. Between the two supporting bodies 61 and deposition unit 11, a tubular part 63 extends coaxially on the outer side of which spray nozzles 62 are provided. The diameter of tubular part 63 is approximately one third of the diameters of the supporting bodies 61. Via the lines 65 which end in coupling pieces 64 of the supporting bodies 61 and are connected to lines 66 (FIG. 1), liquid can be supplied to the spray nozzles 62 for spraying this liquid towards the inner side of the substrate 2 via the spray nozzles 62 and thus depositing a layer on the substrate 2. In this case, it is furthermore possible for the tubular part 63 to be rotatable about its axis with respect to the supporting bodies 61, which promotes the uniform distribution of the thickness of the deposited layer on the substrate 2. On the outer sides of the supporting bodies 61, blow nozzles 67 are provided which, in use, may provide a gas bearing between the supporting bodies 61 and the substrate 2. The blow nozzles 67 may be supplied with gas via specific lines 65 and 66. The use of blow nozzles such as blow nozzles 67 may of course also be useful with supporting bodies 51 or with supporting bodies 71 which are still to be discussed in more detail and are associated with deposition unit 10.

In addition, it may be helpful for the spray-coating process if it is carried out in a space with a reduced pressure and/or with a specific gas composition. To this end, gas nozzles 68 are provided on the mutually facing sides of the supporting bodies 61 which are connected to certain lines 65 and associated lines 66.

Figure 7A:
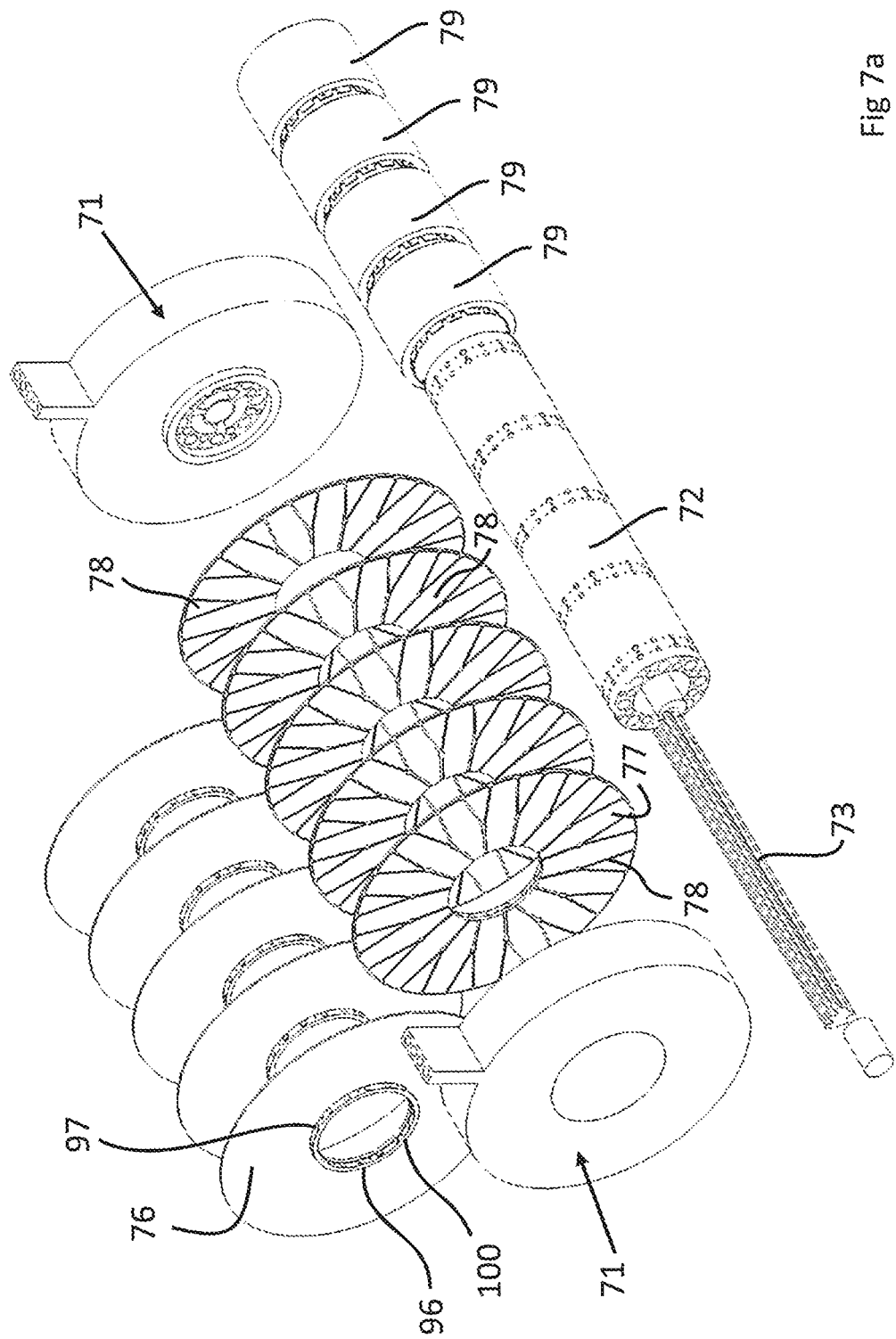
FIG. 7a shows an exploded view of a deposition unit of the sputter-type, forming part of the system.
Figure 7B:
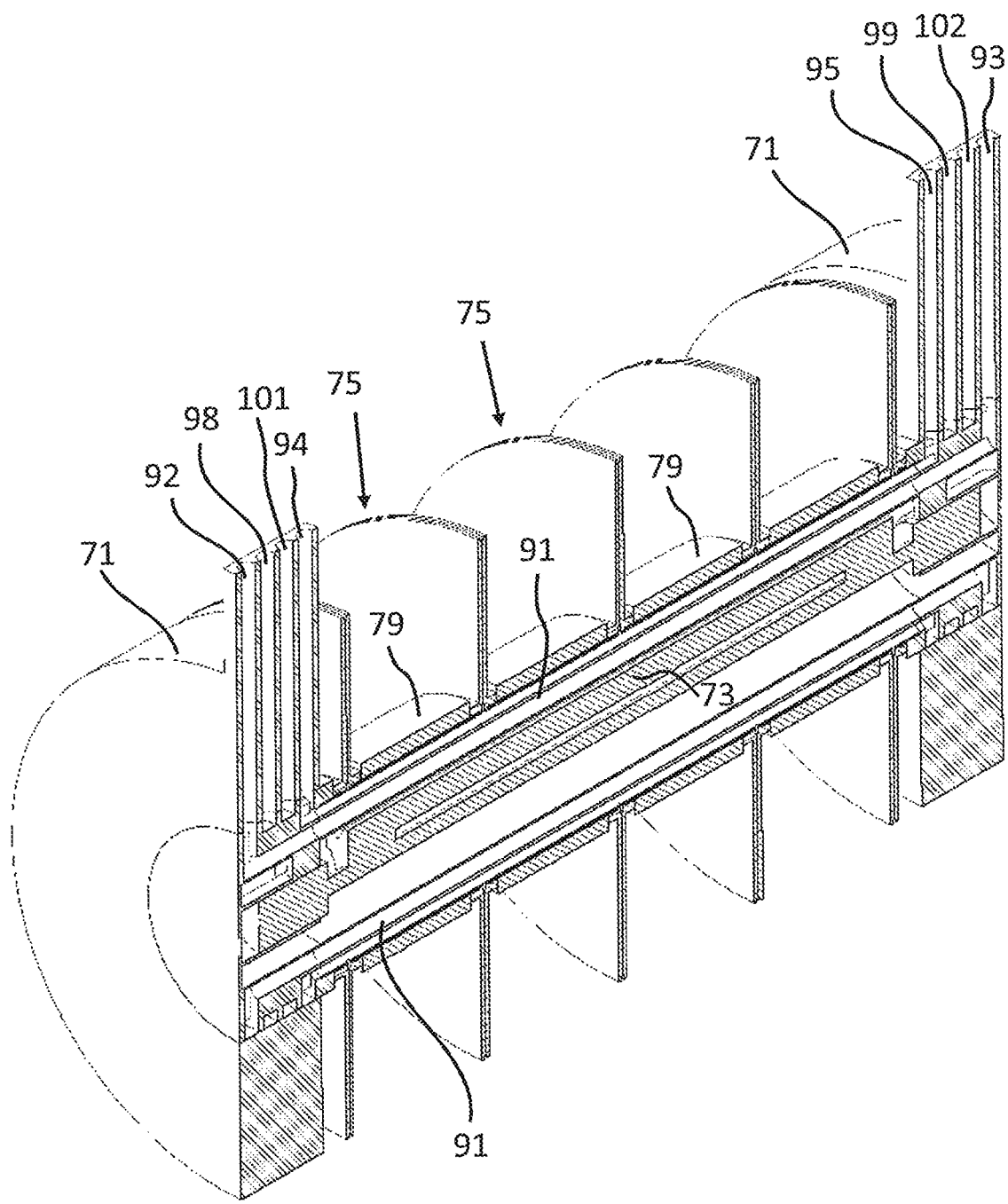

Deposition unit 10 (FIGS. 7a and 7b) is of the sputter type and has disc-shaped stationary supporting bodies 71 at its axial ends. The supporting bodies 71 are similar as regards design and function to supporting bodies 51 or 61. Between the supporting bodies 71, a tubular part 72 extends which is fixedly connected to the supporting bodies 71. On the inner side of the tubular part 72, a magnet 73 is provided which, in use, rotates about the axis of the tubular part 72. The use of such a rotating magnet is described in publication WO 2011/068263 A1 and therefore does not have to be explained in any more detail here.

In an alternative embodiment, deposition unit does not comprise any discs 75 and the gas supply and discharge takes place via the supporting bodies 71.

Deposition unit 10, which is of the sputter type and more specifically of the magnetron sputter type, is provided with a number of, in this example five, composite discs 75 which are concentrically connected to the tubular part 72 at the same intermediate distance. Every disc 75 comprises two disc bodies 76, 77 which are placed against one another and in between form ducts 78 which extend from the tubular part 72 with branches which end on the circumference of the discs 75 at a distance apart. Via these outlets, a gas bearing may be created for the substrate 2 and the support belt 35 on the outer side thereof.

Between the discs 75, target tubes 79 are provided around the tubular part. These are made of the material to be deposited on the substrate 2 by sputtering. During the sputtering process, such as are known per se to those skilled in the art, sputtering gas is ionized. The gas ions are attracted by the target tubes 79 which have been brought to a negative electrical voltage and by the magnet 73, as a result of which the target tubes 79 are bombarded and material is knocked off the target tubes 79. This material will subsequently be deposited on the substrate 2.

Inside the tubular part 72, ducts are provided, such as duct 91 for cooling liquid which is supplied to duct 91 via line 92 and is removed from duct 92 via line 93. The aforementioned gas for the gas bearing may be supplied via lines 94, 95. Each of the disc bodies 76, 77 is provided with a ring 96 on the outer side of the associated disc 75, in which ring 96 vacuum openings 97 are provided. Thus, an area of reduced pressure can be created in the space between the discs 75. The vacuum openings 97 are communicatively connected to lines 98, 99. On the outer sides of the aforementioned rings 96, there are also sputtering gas openings 100 which are communicatively connected to lines 101, 102 and via which, in use, sputtering gas, such as argon, is supplied to the sputtering gas openings 100.

When the system 1 is used, the substrate 2 is passed from the unwinding roller thereof onto the upper side of support belt 35. The substrate 2 follows the shape of the support belt 35 during transportation in the conveying direction 5 along the system 1. This means that, also inside the vacuum tube 8, the substrate 2 assumes a shape which, viewed in cross section, is at least substantially round, in which case the substrate 2 comes to lie on the inner side of the support belt 35, as can be seen particularly clearly in particular in FIG. 6. The width of the strip-shaped substrate 2 is slightly smaller than that of the support belt 35. More specifically, the width of the strip-shaped substrate 2 is at least substantially equal to the length of the arc length part of transverse edge 23.

For each of the four deposition units 10-13, four pressure lines 75 are connected to vacuum tube 8. By means of the pressure lines 75, it is possible to create a reduced pressure inside the vacuum tube 8, more specifically on the outer side of the substrate 2 and of the support belt 35. Thus, a force can be exerted on the substrate 2 which is able to counteract a sucking or pushing force on the inner side of the substrate 2 in order to prevent undesired deformation of the substrate 2 and/or physical contact of the inner side of the substrate 2 with the deposition units 10-13. The support belt 35 also contributes to the dimensional stability of the substrate 2.

While substrate 2 is being transported in conveying direction 5 and the four deposition units 10-13 are working, four layers may be deposited on the substrate 2 in succession. More specifically, system 1 offers, for example, the possibility (see FIG. 9) to use these for the production of CIGS-based solar cells which are known per se to those skilled in the art, in which case a sputter deposition unit 10 is used to first deposit a molybdenum layer 81 with a thickness of between 500 and 1500 nm on a substrate of glass with a thickness of between 100 nm and 1 mm, preferably between 100 μm and 2 mm, which substrate is flexible, so that it is able to follow the above-described deformations between the flat state and the wrapped state. Subsequently, it is possible to deposit a CIGS layer 82 with a thickness of between 1000 and 3000 nm by means of spray-coating deposition unit 11. Using the S-ALD deposition units 12 and 13, it is then possible to successively deposit a Zn(O,S) layer 83 with a thickness of between 20 and 100 nm and a ZNO:Al layer 84 with a thickness of between 50 and 150 nm. In the solar cell, the layers 81-84 will serve as back-electrode, absorber layer, buffer layer and window layer, respectively, as is known per se to those skilled in the art.

Figure 9:
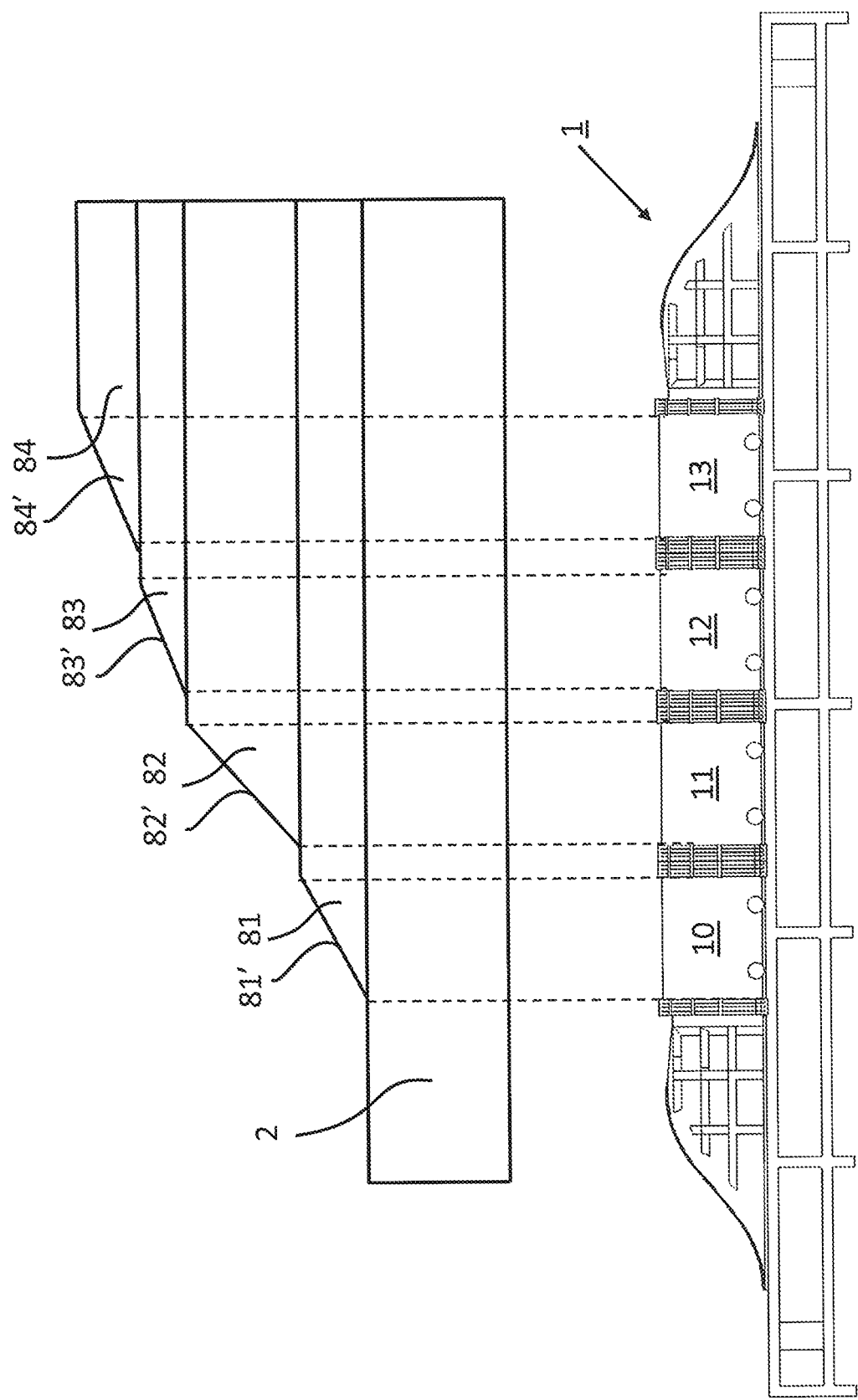
FIG. 9 diagrammatically shows a side view of the construction of four layers on a substrate.

The incline of the lines 81', 82', 83' and 84' in FIG. 9 is the criterion for the speed at which the respective layers 81, 82, 83 and 84 are formed by system 1, more specifically at the location of the respective deposition units 10, 11, 12 and 13 thereof. The speed at which the substrate is passed along the deposition units 10, 11, 12 and 13 is equal for each deposition unit 10, 11, 12 and 13. Incidentally, it is also possible to operate system 1 in a stepwise manner, in which case the substrate is passed along the deposition units in a stepwise manner, i.e. with a non-constant speed which may temporarily even be 0 m/sec during the process. It is possible for the deposition units 10, 11, 12 and 13 to have different lengths in order thus to influence the thickness of the respective layers 81, 82, 83 and 84 deposited at the location of the deposition units 10, 11, 12 and 13.

Although the invention has been explained above by means of an example which involves a strip-shaped substrate including film/foil-like substrates of limited thickness, for example less than 500 μm, it should be understood that it is also possible to use the invention with individual sheet-shaped substrates, for example with a length of between 30 cm and 200 cm and a width of between 30 cm and 200 cm. Such substrates could, for example, be placed on a strip-shaped carrier with the sheet-shaped substrates exactly adjoining or slightly overlapping each other. For the sheets, the system could also comprise a separate wrapping device in order to deform the sheets from a flat shape to a cylindrical shape, i.e. where said deformation is not or at least not only brought about by the deformation of a carrier situated underneath.

Although the various deposition units 10, 11, 12 and 13 and variants thereof have been described above as part of a system 1 in which all deposition units 10, 11, 12 and 13 are arranged one after the other in series, it is also possible to use the various deposition units 10, 11, 12, 13 individually, for example in order to only deposit a single layer on a substrate or to use one deposition unit in combination with only one or two other deposition units, or to use a number of deposition units of the same type.

Furthermore, it is conceivable to design the various deposition units 10, 11, 12 or 13 without parts which protrude between the longitudinal edges of the substrate 2, such as coupling pieces 53 and 64. This offers the possibility to wrap the substrate around the respective deposition unit over the entire circumference, that is to say over 360 degrees or even slightly more, so that the longitudinal edges of the substrate abut one another or overlap to some degree. The supply and discharge of gases as takes place via the aforementioned protruding parts, such as coupling pieces 53, 64, would then take place via the ends of the cylindrical part of the substrate 2, for example via the (points of the) V-shaped areas, as can be seen in FIG. 1, which are defined by aforementioned longitudinal edges of the substrate 2 on the upstream and downstream side of the respective (combination of) deposition unit/units. Such an embodiment may be particularly advantageous with relatively short systems.

Figure 10:
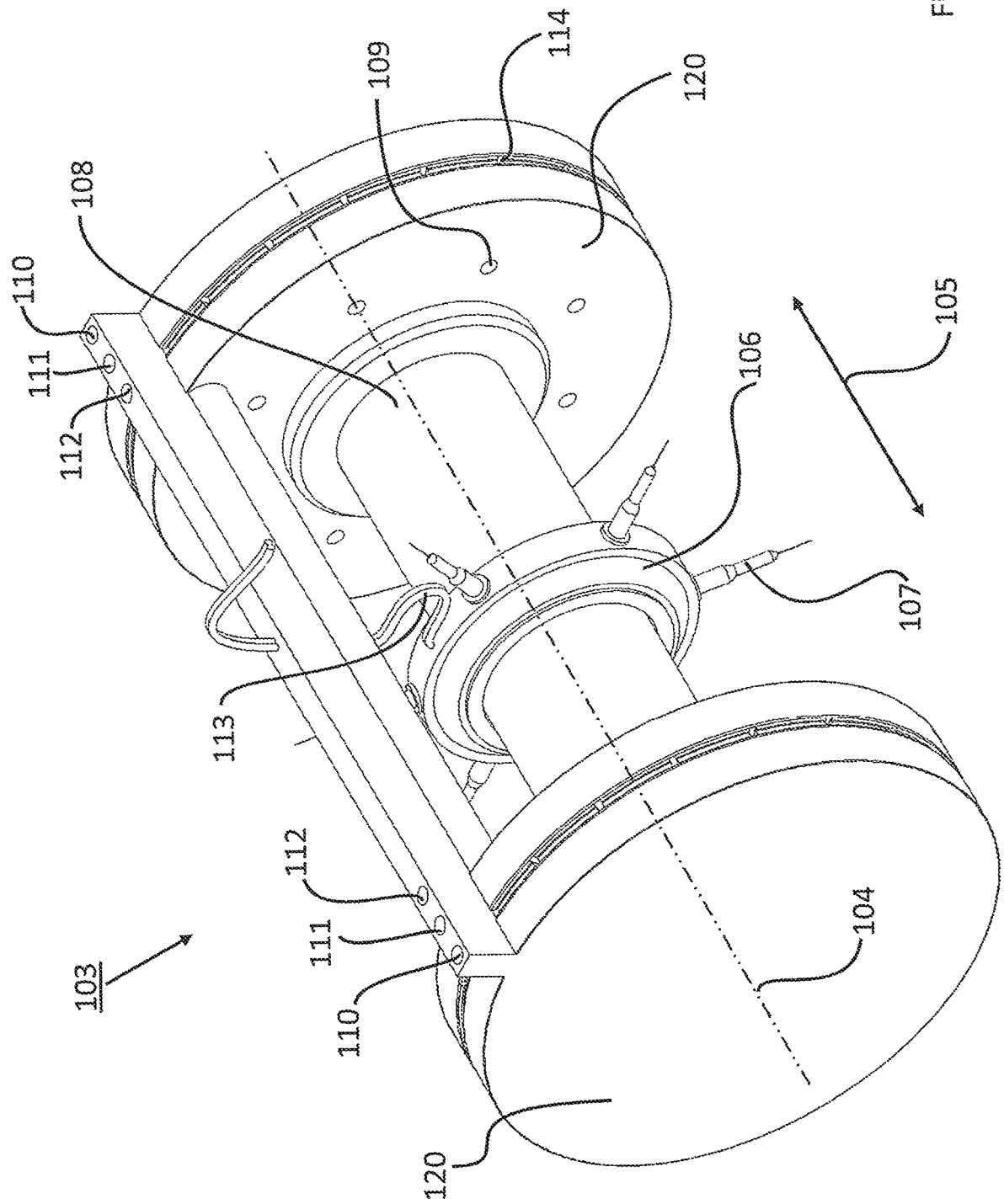
FIG. 10 shows a laser treatment unit of the laser-scribing type.

FIG. 10 shows a laser treatment unit 103 which is more specifically of the laser-scribing type. Such a laser treatment unit 103 may be used particularly advantageously in the production of solar cells, but not only there. Laser treatment unit 103 may form an extension of system 1 and may be provided, for example, downstream and directly adjacent to deposition unit 13. On its two opposite sides, laser treatment unit 103 comprises a stationary supporting body 120, the design of each of which is identical to that of supporting bodies 51. Just like the deposition body 41 of every deposition unit 12, 13 of the S-ALD type, the supporting bodies 120 serve to support the substrate 2. This support may take place both directly and via a gas bearing between the supporting bodies 120 and the substrate 2, to which end lines which end in circumferential grooves 114 on the outer sides of the supporting bodies 120 are communicatively connected to lines 110 for the supply of gas to grooves 114. Between the supporting bodies 120, laser treatment unit 103 furthermore comprises a disc-shaped treatment body 106 which is provided with a number of, in this example six, laser heads 107 which are situated at the same radial distance apart. The disc-shaped treatment body 106 is rotatable about axis 104 of tube 108 and can be moved to and fro in translation with respect to tube 108 according to double arrow 105 by means of drive means (not shown) which are provided inside one or both supporting bodies 120 or tube 108. By means of the translational and rotating movement, the disc-shaped body 106 to which the laser heads 107 are attached is able to follow a pattern on the substrate, in which case the speed of the substrate in the conveying direction thereof which runs parallel to double arrow 105 is taken into account. Using the six laser heads 107, the substrate is divided into six parts, with each laser head for example being able to perform the same movement. The laser treatment process may benefit from a reduced pressure and/or a specific gas composition on the inner side of the substrate, i.e. between the supporting bodies 120. To this end, the mutually facing sides of the supporting bodies 120 are provided with gas nozzles 109 which are communicatively connected to lines 111. Lines 112 are connected to the tubular part 108 and serve to transport cooling liquid. The disc-shaped body 108 is provided with a flexible cable 113 which provides electrical power to the laser.

The invention claimed is:

1. A system for depositing a first layer on a flexible strip-shaped or sheet-shaped substrate and a second layer on the first layer, the system comprising:
    a first deposition unit of a first type for depositing the first layer, the first deposition unit including a first supporting body having a first central line and a radial outer side that is rotationally symmetrical with respect to the first central line;
    a conveying device for conveying the substrate in a conveying direction that extends parallel to the first central line of the first supporting body along the radial outer side of the supporting body;
    a second deposition unit of a second type, positioned downstream of the first deposition unit, for depositing the second layer on the first layer, the second deposition unit including a second supporting body having a second central line that is in line with the first central line and a radial outer side that is rotationally symmetrical with respect to the second central line; and
    a wrapping device for keeping the substrate in a wrapped state, the substrate being held wrapped around at least a part of the radial outer sides or around the entire radial outer sides of the first supporting body and of the second supporting body.

2. The system according to claim 1, wherein at least one of the first type and the second type is a Spatial Atomic Layer Deposition (S-ALD) type, a Chemical Vapor Deposition (CVD) type, a sputter-type or a spray-coating type.

3. The system according to claim 1, wherein the first type and the second type are different.

4. The system according to claim 1, wherein at least one of the first deposition unit and the second deposition unit comprises a vacuum-device for creating a reduced pressure on the outer side of the substrate.

5. The system according to claim 1, wherein at least one of the first type and the second type is a Spatial Atomic Layer Deposition (S-ALD) type, the supporting body associated with the deposition unit of the S-ALD type is cylindrical, has a central line, and includes an arcuate or circular deposition surface on its radial outer side, and the deposition unit of the S-ALD type includes a gas supply device for supplying precursor gas to the deposition surface thereof, and a first drive device for driving the supporting body about the central line in a rotating manner, the supporting body configured to supply the precursor gas to the inner side of a substrate wrapped around the supporting body via the deposition surface thereof to deposit a layer on or at least on the inner side of the substrate, due to a chemical reaction of the precursor gas on or near the substrate.

6. The system according to claim 1, wherein at least one of the first type and the second type is a spray-coating type, wherein the deposition unit of the spray-coating type comprises a spray body having a central line that coincides with the central line of the supporting body associated with the deposition unit of the spray-coating type and wherein the spray body includes spray nozzles for spraying the spray material to be deposited from the spray nozzles to the inner side of a substrate wrapped around the supporting body for depositing a layer of the spray material on or at least on the inner side of the substrate.

7. The system according to claim 6, wherein the deposition unit of the spray-coating type includes a second drive device for driving the spray body in a rotating manner about the central line of the spray body.

8. The system according to claim 1, wherein at least one of the first supporting body and the second supporting body is ring-shaped or disc-shaped.

9. The system according to claim 8, wherein openings are provided on the radial outer side of at least one of the first supporting body and the second supporting body for allowing a gas to pass through the openings in a radially outwardly directed direction for, in use, creating a gas layer between the inner side of a substrate wrapped around at least one of the first supporting body and the second supporting body and the respective at least one of the first supporting body and the second supporting body.

10. The system according to claim 1, wherein the conveying device includes a first deformation device positioned on an upstream side of the first deposition unit for deforming the substrate from a flat state of the substrate to the wrapped state during transportation of the substrate.

11. The system according to claim 10, wherein the first deformation device comprises a first guide body having a first guiding surface that is curved in two perpendicular directions for guiding the substrate for deforming the substrate from the flat state to the wrapped state during transportation of the substrate along the first guiding surface.

12. The system according to claim 10, wherein the conveying device includes a second deformation device positioned on a downstream side of the second deposition unit for deforming the substrate from the wrapped state of the substrate to a flat state during transportation of the substrate.

13. The system according to claim 12, wherein the second deformation device comprises a second guide body having a second guiding surface that is curved in two perpendicular directions for guiding the substrate for deforming the substrate from the wrapped state to the flat state during transportation of the substrate along the first guiding surface.

14. The system according to claim 1, wherein the conveying device comprises an unwinding body positioned on an upstream side of the first deposition unit for supporting and unwinding a roll of the substrate.

15. The system according to claim 1, wherein the conveying device comprises a winding body positioned on a downstream side of the second deposition unit for supporting the substrate and winding the substrate to form a roll.

16. The system according to claim 15, wherein the conveying device comprises an endless flexible support belt for supporting the substrate on the outer side of the substrate in the wrapped state of the substrate, and a first circulating body positioned on an upstream side of the first deposition unit, a second circulating body positioned on a downstream side of the second deposition unit around which circulating bodies the support belt is wrapped, and a fourth drive device for driving the support belt such that, during use, the support belt moves in the conveying direction together with the substrate in an area where the substrate is supported by the support belt.

17. The system according to claim 16, wherein the wrapping device comprises two elongate guide members positioned on the outer sides of the first supporting body and the second supporting body, wherein the two elongate guide members extend parallel to each other and to the conveying direction for guiding the support belt on opposite longitudinal edges thereof.

18. The system according to claim 17, wherein the wrapping device comprises two elongate wrapping members positioned on the outer sides of the first supporting body and the second supporting body, wherein the two elongate wrapping members extend parallel to each other and to the conveying direction for wrapping the support belt around, proximate the longitudinal edges thereof.

19. The system according to claim 1, wherein the system comprises at least one further deposition unit for depositing at least one further layer, each of the at least one further deposition unit comprising a further supporting body with a further central line which is in line with the first central line and with the second central line, each further deposition unit being of the first type, of the second type or of a further type.

20. The system according to claim 1, further comprising a laser treatment unit for treating at least one of the substrate, the first layer, and the second layer with at least one laser beam, wherein the laser treatment unit includes a third supporting body having a third central line and a radial outer side that is rotationally symmetrical with respect to the third central line, wherein the third central line is in line with the first central line.

* * * * *